US008999059B2

(12) United States Patent
Imai et al.

(10) Patent No.: US 8,999,059 B2
(45) Date of Patent: Apr. 7, 2015

(54) PROCESS FOR PRODUCING A NITRIDE SINGLE CRYSTAL AND APPARATUS THEREFOR

(75) Inventors: Katsuhiro Imai, Nagoya (JP); Makoto Iwai, Kasugai (JP); Takanao Shimodaira, Nagoya (JP); Takatomo Sasaki, Suita (JP); Yusuke Mori, Suita (JP); Fumio Kawamura, Suita (JP)

(73) Assignees: NGK Insulators, Ltd., Nagoya (JP); Osaka University, Suita (JP)

( * ) Notice: Subject to any disclaimer, the term of this patent is extended or adjusted under 35 U.S.C. 154(b) by 0 days.

(21) Appl. No.: 12/234,786

(22) Filed: Sep. 22, 2008

(65) Prior Publication Data

US 2009/0078193 A1    Mar. 26, 2009

Related U.S. Application Data (63) Continuation of application No. PCT/JP2007/053862, filed on Feb. 22, 2007.

(30) Foreign Application Priority Data

Mar. 24, 2006   (JP) .................................. 2006-82044

(51) Int. Cl.
  *C30B 9/12*   (2006.01)
  *C30B 35/00*   (2006.01)
  *C30B 9/00*   (2006.01)
  *C30B 29/40*   (2006.01)

(52) U.S. Cl.
  CPC ................ *C30B 9/00* (2013.01); *C30B 29/403* (2013.01); *C30B 29/406* (2013.01)

(58) Field of Classification Search
  USPC .................... 117/54, 73, 78, 81, 83, 952, 200
  See application file for complete search history.

(56) References Cited

U.S. PATENT DOCUMENTS

| 3,796,552 | A   * | 3/1974  | Robinson et al. ............. 117/223 |
| 4,666,681 | A   * | 5/1987  | Ferrand et al. ................ 117/223 |
| 6,592,663 | B1    | 7/2003  | Sarayama et al. |
| 7,435,295 | B2    | 10/2008 | Kitaoka et al. |
| 2002/0108559 | A1* | 8/2002 | Iwane et al. ..................... 117/54 |
| 2003/0070606 | A1* | 4/2003 | LeBlond et al. ................ 117/84 |
| 2004/0183090 | A1  | 9/2004 | Kitaoka et al. |
| 2006/0048699 | A1* | 3/2006 | D'Evelyn et al. ............... 117/68 |

(Continued)

FOREIGN PATENT DOCUMENTS

| EP | 1634981 A1 * | 3/2006 | ............ C30B 29/38 |
| JP | 2000-203981 A1 | 7/2000 | |
| JP | 2000-211999 A1 | 8/2000 | |

(Continued)

OTHER PUBLICATIONS

English Translation of SU 997778 (A1) (2014) p. 1-4.*

(Continued)

*Primary Examiner* — Matthew Song
(74) *Attorney, Agent, or Firm* — Burr & Brown, PLLC (57) ABSTRACT

A growth apparatus is used having a plurality of crucibles each for containing the solution, a heating element for heating the crucible, and a pressure vessel for containing at least the crucibles and the heating element and for filling an atmosphere comprising at least nitrogen gas. One seed crystal is put in each of the crucibles to grow the nitride single crystal on the seed crystal.

25 Claims, 10 Drawing Sheets

(56) References Cited

U.S. PATENT DOCUMENTS

2007/0215035 A1* 9/2007 Kitaoka et al. ............... 117/84
2007/0296061 A1 12/2007 Sasaki et al.

FOREIGN PATENT DOCUMENTS

| | | | |
|---|---|---|---|
| JP | 2001-064098 A1 | | 3/2001 |
| JP | 2001-192295 A1 | | 7/2001 |
| JP | 2004-224600 A1 | | 8/2004 |
| JP | 2005-012171 A1 | | 1/2005 |
| JP | 2005-247615 A1 | | 9/2005 |
| JP | 2005-263622 A1 | | 9/2005 |
| JP | 2005-298269 A1 | | 10/2005 |
| SU | 997778 A * | 2/1983 | ............... B01F 9/00 |
| WO | WO 2005080648 A1 * | 9/2005 | ............. C30B 19/02 |

OTHER PUBLICATIONS

U.S. Appl. No. 12/181,402, filed Jul. 29, 2008, Iwai et al.
U.S. Appl. No. 12/190,230, filed Aug. 12, 2008, Iwai et al.
U.S. Appl. No. 12/192,428, filed Aug. 15, 2008, Iwai et al.
U.S. Appl. No. 12/212,722, filed Sep. 18, 2008, Iwai et al.
U.S. Appl. No. 12/234,799, filed Sep. 22, 2008, Imai et al.
U.S. Appl. No. 12/284,470, filed Sep. 22, 2008, Ichimura et al.
Fumio Kawamura eta l., *"Novel Liquid Phase Epitaxy (LPE) Growth Method for Growing Large GaN Single Crystals: Introduction of the Flux Film Coated-Liquid Phase Epitaxy (FFC-LPE) Method,"* Japan Journal of Applied Physics, vol. 42 (2003), pp. L-879-L881.
Chinese Office Action (Application No. 201210003531.7) dated Nov. 12, 2013.

* cited by examiner

PROCESS FOR PRODUCING A NITRIDE SINGLE CRYSTAL AND APPARATUS THEREFOR

FIELD OF THE INVENTION

The present invention relates to a method and apparatus for producing a nitride single crystal.

BACKGROUND OF THE INVENTION

Gallium nitride-based III-V nitrides, which receive attention as excellent blue light-emitting devices, are actually used for the production of light-emitting diodes, and expected to be used as optical pickup blue-violet semiconductor laser devices as well. In a method for growing a GaN single crystal described in "Jpn. J. Appl. Phys." vol. 42 (2003), pp. L879-L881, a boron nitride crucible is placed in a pressure-resistant vessel, metallic Ga of a group III material and Na as flux are put in the boron nitride crucible, and high-pressure nitrogen gas is supplied to the pressure-resistant vessel. Then nitrogen of a group V material is dissolved in the Ga—Na mixed melt through the application of heat and pressure to grow a GaN single crystal on a seed crystal substrate in the crucible. At that time, the boron nitride crucible is oscillated by attaching a rotating shaft to an electric furnace that accommodates the boron nitride crucible, connecting the rotating shaft to a motor shaft, and then starting the motor.

Moreover, according to Japanese Patent Publication (Laid-Open) Nos. 2001-64098A and 2005-298269A, in growing a GaN single crystal by the flux method, one crucible is placed in a pressure vessel, one seed crystal is put in the crucible, and then the GaN single crystal is grown on the seed crystal.

Furthermore, Japanese Patent Application Publication (Laid-Open) No. 2004-224600A describes a case in which one crucible is placed in a pressure vessel and plural seed crystals are put in the crucible to grow plural crystals.

SUMMARY OF THE INVENTION

In the method for growing a nitride single crystal by placing one crucible in a pressure vessel and putting one seed crystal in the crucible, only one crystal can be produced per one operation, and thus it is difficult to enhance its productivity. On the other hand, as described in Japanese Patent Application Publication (Laid-Open) No. 2004-224600A, the inventors tried a method in which plural seed crystals were put in a crucible to grow plural single crystals at one time. Through the use of this method, the productivity of the crystal should be enhanced.

However, as a result of its actual production, it has been found that there are differences in the state and crystallinity of single crystals produced in different seed crystals, and unevenness in their quality has been revealed. The reason is not obvious, but, it can be considered that since temperature distribution and material concentrations are slightly uneven at each place in the crucible, there is a difference in states of convection and the growth conditions of the crystals are varied. Accordingly, even when the growth of fine-quality single crystals is successful on a certain seed crystal, single crystals grown on other seed crystals in the same crucible tend to be defective, and therefore it has been found that the yield of the crystal is low and enhancement of productivity is difficult.

An object of the present invention is to provide a method for producing a nitride single crystal using a solution containing flux and a raw material, by which the productivity of the single crystal can be enhanced and the number of defects decreased, and which is suitable for the mass production of the single crystal, and an apparatus used in the production method.

The present invention provides a method for producing a nitride single crystal using a solution containing a flux and a raw material, the method preferably uses a growth apparatus including:
   a plurality of crucibles each for containing the solution,
   a heating element for heating the crucible, and
   a pressure vessel for containing at least the crucibles and the heating element and filling an atmosphere comprising at least nitrogen gas;
   the method further comprising putting one seed crystal in each of the crucibles to grow the nitride single crystal on the seed crystal.

The present invention further provides an apparatus for producing a nitride single crystal using a solution comprising a flux and a raw material, the apparatus including:
   a plurality of crucibles each for containing the solution;
   a heating element for heating the crucible; and
   a pressure vessel for containing at least the crucibles and the heating element and for filling an atmosphere comprising at least nitrogen gas.

The present inventors considered based on the foregoing findings that the growth of single crystals is made by placing multiple crucibles in a pressure vessel and putting one seed crystal in each crucible. Such a method has not been considered, because it has been conventionally thought that crucibles are expensive and sufficiently high productivity can be achieved by growing nitride single crystals by putting plural seed crystals into a crucible. However, as a result of their consideration, the present invention has been accomplished so that a plurality of fine-quality single crystals are simultaneously grown by making the growth conditions of the single crystals on seed crystals in the crucibles uniform.

DETAILED DESCRIPTION OF THE INVENTION

In the present invention, a pressure vessel accommodates multiple crucibles and a heating element, and is filled with an atmosphere containing at least nitrogen gas. Then, one seed crystal is put in each crucible to grow a nitride single crystal on the seed crystal.

The specific form of the crystal growth is not particularly limited; however, since there is a need to increase the volumetric capacity of the pressure vessel to place the multiple crucibles in the pressure vessel, it is necessary to maintain uniformity in the temperature of each crucible in the pressure vessel. Accordingly, it is preferable to design a crystal-growing apparatus such that the temperatures of the crucibles can be made uniform.

In a preferred embodiment, a setter is used that is made of a thermally-conductive material, which accommodates multiple crucibles. Such a setter can make the temperatures of the crucibles therein uniform, which brings a further advantage in improving its productivity. The setter herein refers to an instrument, or a vessel, provided to the crystal-growing apparatus to accommodate and fix the crucibles.

Although such a thermally-conductive material is not particularly limited, there is a need to have high thermal conductivity and flux-vapor durability. Therefore AlN, SiC, silicon, graphite, silver, copper, a copper alloy, tungsten, or iridium is preferred.

In another preferred embodiment, the setter has plural accommodation chambers horizontally placed, and each accommodation chamber accommodates the crucible. Therefore, uniformity in the temperatures of the crucibles can be maintained in a horizontal direction in the setter. Consequently, multiple single crystals can be simultaneously grown in a horizontal direction in the pressure vessel.

In still another preferred embodiment, crucible-heating means is used corresponding to each accommodation chamber in the setter. The crucible-heating means can control the temperature of the crucible in each accommodation chamber more precisely. For example, when the temperature of the crucible placed at the center of the setter is decreased, the occurrence of a defective can be prevented by further heating only the accommodation chamber that accommodates the crucible.

Such crucible-heating means is not particularly limited; however, resistance heating or high-frequency induction heating means are preferred.

In still another preferred embodiment, temperature-measuring means is used corresponding to each accommodation chamber to measure the temperature around the crucible in each accommodation chamber. The temperature-measured values are fed back to a temperature-control unit, whereby the calorific value of each heating element, in particular, the heating element attached to the setter, can be controlled. Through such workings, the temperature of the crucible in each accommodation chamber can be controlled, and thus the occurrence of defects occurring in the crucibles can be prevented.

In still another preferred embodiment, multiple heating elements are vertically placed within the pressure vessel to separately control the calorific values of the heating elements; that is, multiple-zone control is performed in the vertical direction. Since the inside of the pressure vessel is subjected to a high temperature and a higher pressure, the temperature gradient in the vertical direction tends to become high, and therefore there is a tendency for defects to occur frequently at part of the rows of the setters when viewed in the vertical direction. Therefore, the multiple heating elements or work coils for high-frequency induction heating are placed in the vertical direction and the heating elements are zone-controlled, whereby the occurrence of defects due to the temperature gradient in the vertical direction can be suppressed.

In still another preferred embodiment, by moving the pressure vessel during the growth of nitride single crystals, solutions in the crucibles are stirred simultaneously. That is, by moving the pressure vessel, solutions in the crucibles within the pressure vessel can be simultaneously stirred with equal driving force.

In this case, the pressure vessel can be revolved around a revolution axis, rotated on its own axis, or revolved therearound and rotated thereon along a horizontal plane. However, since a number of pipes and wires are generally connected to the pressure vessel, they may be entangled as the vessel rotates on its own axis. Therefore, it is particularly preferable to revolve the pressure vessel around the revolution axis.

Furthermore, a protuberance can be formed on the undersurfaces of the crucibles to oscillate the crucibles when the pressure vessel is moved. In this case, a suitably controlled oscillation can be given to the crucibles without directly providing a driving mechanism to the crucibles, in particular.

In still another preferred embodiment, a protuberance is formed on the undersurface of the setter to oscillate the setter by moving the pressure vessel. In this case, a suitably controlled oscillation can be given to the crucibles accommodated within the setter without directly providing a driving mechanism to the setter, in particular.

Moreover, the pressure vessel may be precessed instead of providing any one of the revolution around the revolution axis, the rotation on its own axis and/or both in the horizontal direction. The precession refers to a motion that the pressure vessel is revolved around the vertical line with the center line of the vessel tilted from the vertical line. During the precession, the pressure vessel is not rotated on its own axis. Through the precession, the solutions in the crucibles within the pressure vessel can be simultaneously stirred with equal driving force.

In order to stir the solutions in the crucibles, it is not always necessary to move the pressure vessel; for example, either of the following two methods or both can be used.

(1) A driving mechanism is connected to the setter and the crucibles accommodated within the setter are moved by moving the setter, whereby the solutions in the crucibles are stirred.

(2) A driving mechanism is directly connected to each crucible and the solution in each crucible is stirred by moving each crucible.

In another preferred embodiment, a stirring medium, at least a surface of which is made of a material unreactive with the solution, is put in the crucible to grow a nitride single crystal. When the solutions are stirred by the foregoing method in such a state, they can be stirred more efficiently compared with not using such a stirring medium, and therefore crystals of a more uniform quality can be grown.

In still another preferred embodiment, there is provided a monitor in which a substance, having a viscosity close to that of the solutions under the conditions of the nitride single crystal growth, is included. The conditions of the solutions in the crucibles within the pressure vessel that cannot be observed directly can be presumed by observing the condition of the solution in the monitor. Further, by observing the condition of the substance in the monitor, a driving force to be applied to the pressure vessel or the crucibles can be optimized, and thereby the conditions of the solutions being stirred in the crucibles within the pressure vessel can be optimized.

In this embodiment, a crucible or another vessel is provided within the monitor to include the substance therein. At that time, a temperature in the monitor may be set to room temperature or a suitable temperature higher than room temperature. However, at measurement temperature, the substance is needed to have a viscosity close to that of the growth solution under the predetermined growth conditions (temperature and pressure). The difference in viscosity between the substance and the growth solution is preferably 50 centipoises or smaller, more preferably 20 centipoises or smaller. It is noted that the viscosity is measured using a rotating viscometer.

As means to observe the substance within the monitor, the position of the solution surface or the position of the center of gravity of the vessel within the monitor can be measured, although visual observation may be applied.

In the following, embodiments of the present invention will be described in more detail.

Figure 1:
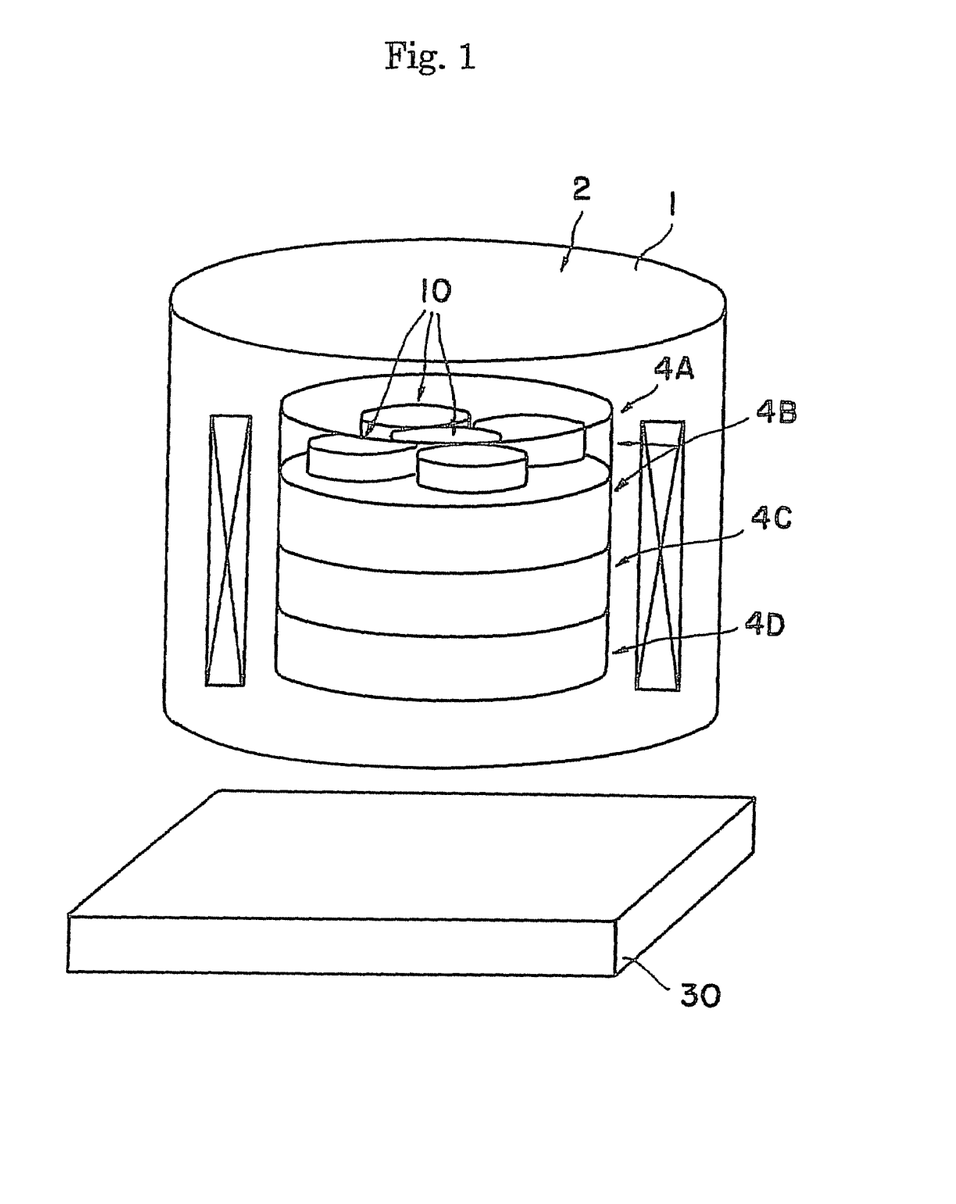
FIG. 1 is a transparent perspective view schematically illustrating a production apparatus according to an embodiment of the present invention.
Figure 2:
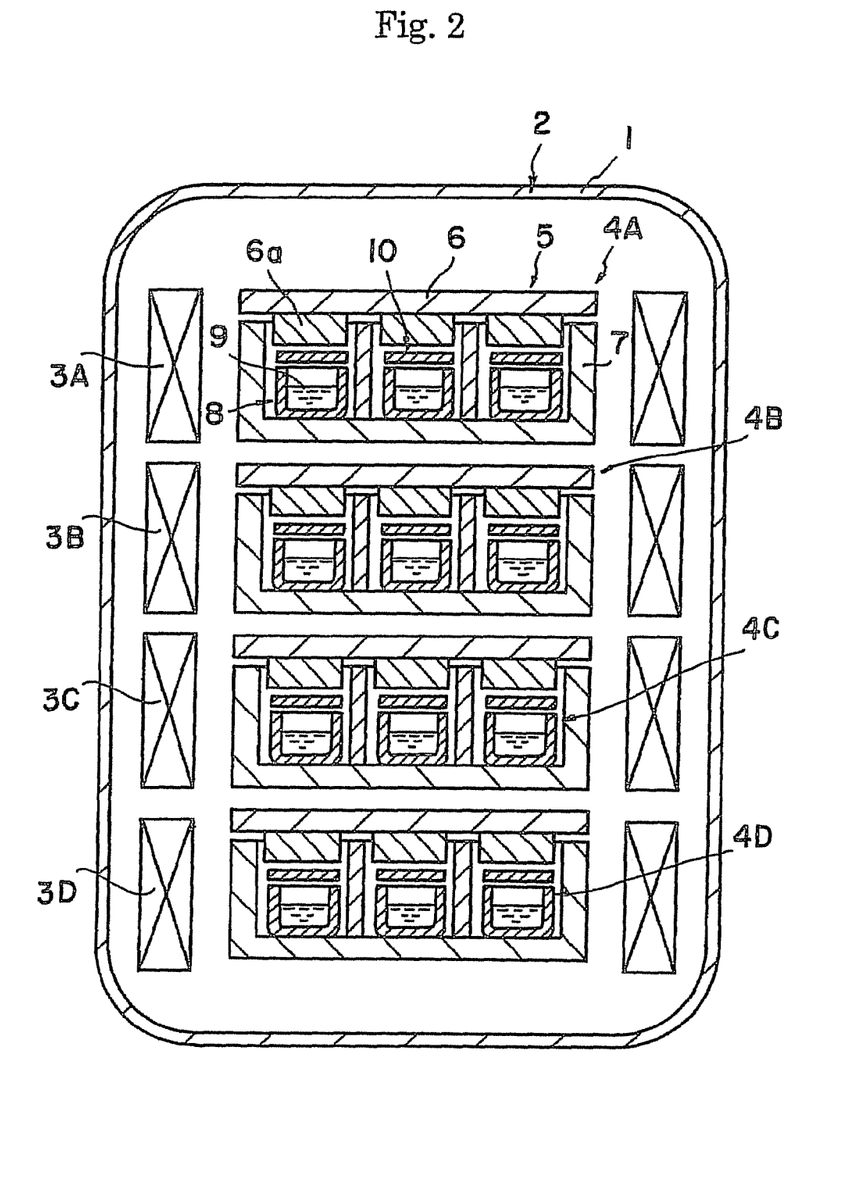
FIG. 2 is a perspective elevational view schematically illustrating the production apparatus according to the embodiment of the present invention.

FIG. 1 is a transparent perspective view schematically illustrating a growing apparatus according to an embodiment of the present invention, and FIG. 2 is a perspective view schematically illustrating the apparatus of FIG. 1. FIG. 3(a) is a cross-sectional view of a setter 5, and FIG. 3(b) is a top view of the setter 5.

Figure 3:
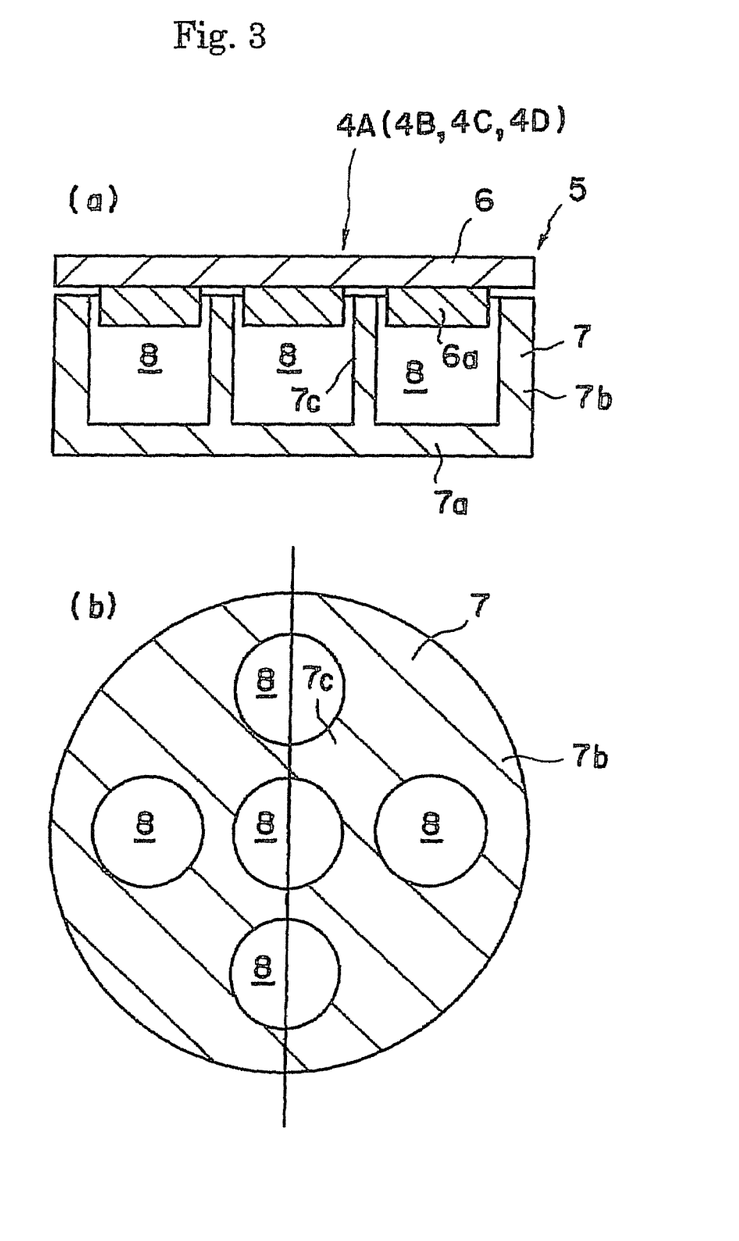
FIG. 3(a) is a cross-sectional view schematically illustrating a setter 5.
FIG. 3(b) is a transverse sectional view of the setter 5 of FIG. 3(a).

In this embodiment, plural heating zones (growing zones) 4A, 4B, 4C and 4D are vertically provided within an internal space 2 of a pressure vessel 1. The number and placement of the heating zones (growing zones) can be changed as appropriate. Ring-shaped heating elements 3A, 3B, 3C and 3D are provided to the heating zones 4A, 4B, 4C and 4D, respectively. Inside each heating element, the setter 5 of FIG. 3 is provided. The pressure vessel 1 is fixed on a support 30, and pipes and wires (not shown) are provided to the pressure vessel 1.

Each setter 5 is comprised of a lid 6 and a body 7, and the lid 6 and the body 7 form plural accommodation chambers 8. At places corresponding to each accommodation chamber 8 on the lid 6, circular protuberances 6a are formed. Further, each body 7 is comprised of a bottom plate 7a, an outer wall 7b and a partition wall 7c; these form the accommodation chambers 8. The outer wall 7b and the partition wall 7c mainly promote heat transfer in the vertical direction of FIG. 1. The base plate 7a and the partition wall 7c promote heat transfer in the horizontal direction of FIG. 1.

Figure 4:
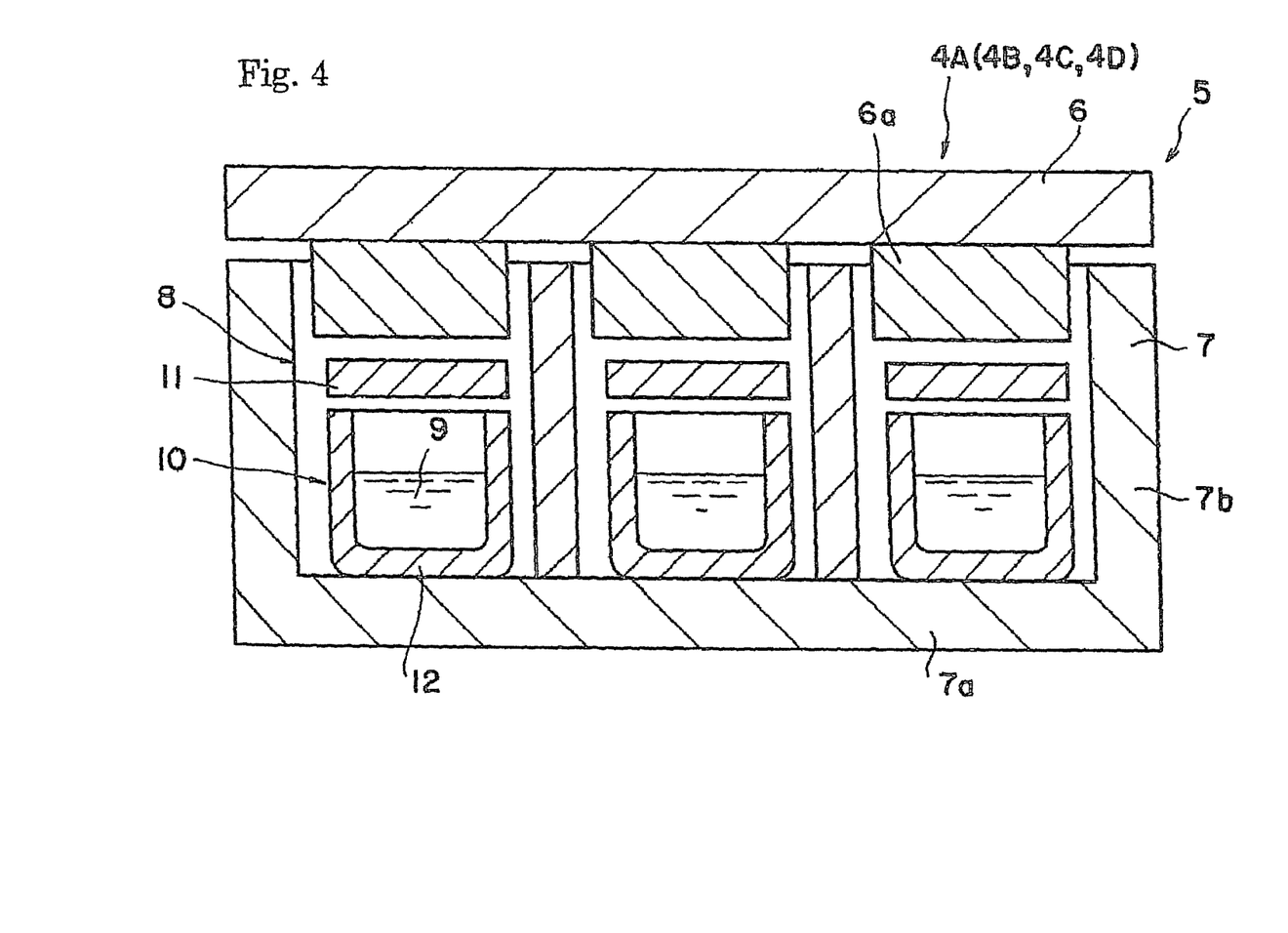
FIG. 4 is a cross-sectional view schematically illustrating the setter 5 accommodation chambers of which accommodate crucibles, respectively.

As shown in FIG. 4, crucibles 10 are placed in the accommodation chambers 8 of the setters 5, respectively. Each crucible 10 is comprised of a lid 11 and a body 12. In each crucible 10, a seed crystal 32, a predetermined growth material, and optionally an additive and a dopant are put, and at the time of the growth, solutions 9 are produced through the application of heat and pressure.

Figure 5:
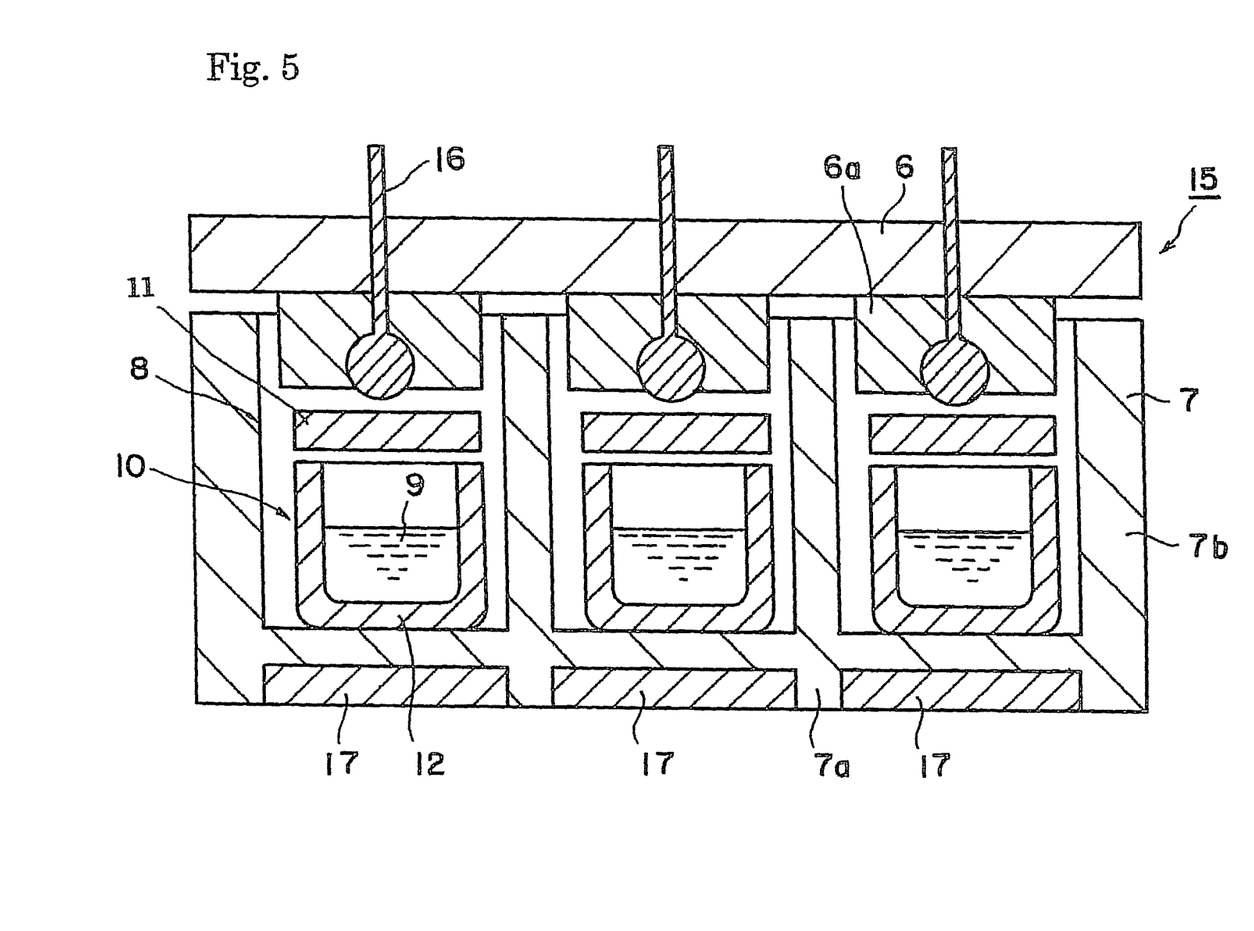
FIG. 5 is a cross-sectional view schematically illustrating a setter 15 provided with temperature-measuring means and a heating element both corresponding to each accommodation chamber.

Furthermore, as shown in FIG. 5, temperature-measuring means 16 can be provided to portions corresponding to the individual accommodation chambers 8 of a setter 15. Such temperature-measuring means is not particularly limited; however, a sheathed thermocouple is preferably used.

Moreover, heating elements 17 can be provided at places corresponding to the individual accommodation chambers 8 on the bottom plate 7a, and the temperatures of the specified points of the accommodation chambers are measured by the temperature-measuring means 16. When the measured temperature is too high or too low, the calorific value of each heating element is changed, whereby the occurrence of a defect can be prevented.

Figure 6:
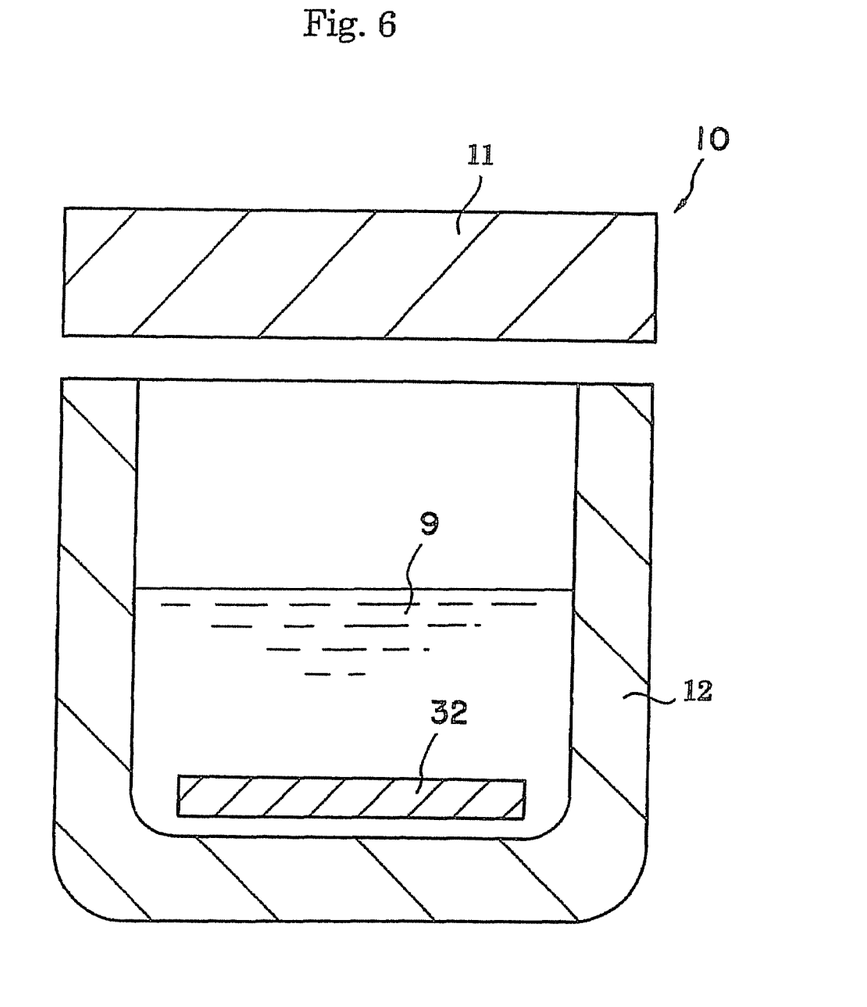
FIG. 6 is a cross-sectional view of a crucible 10 in which a solution 9 and a seed crystal 32 are put.

The shape of the crucibles also is not particularly limited; for example, as shown in FIG. 6, the lid 11 of the crucible 10 can be formed into the shape of a flat plate, and the body 12 of the crucible can be formed such that its undersurface is flat. Also, it is preferable to form a protuberance corresponding to the inner diameter of the body 12 of the crucible 10 on the undersurface of the lid 11 of the crucible.

Figure 7:
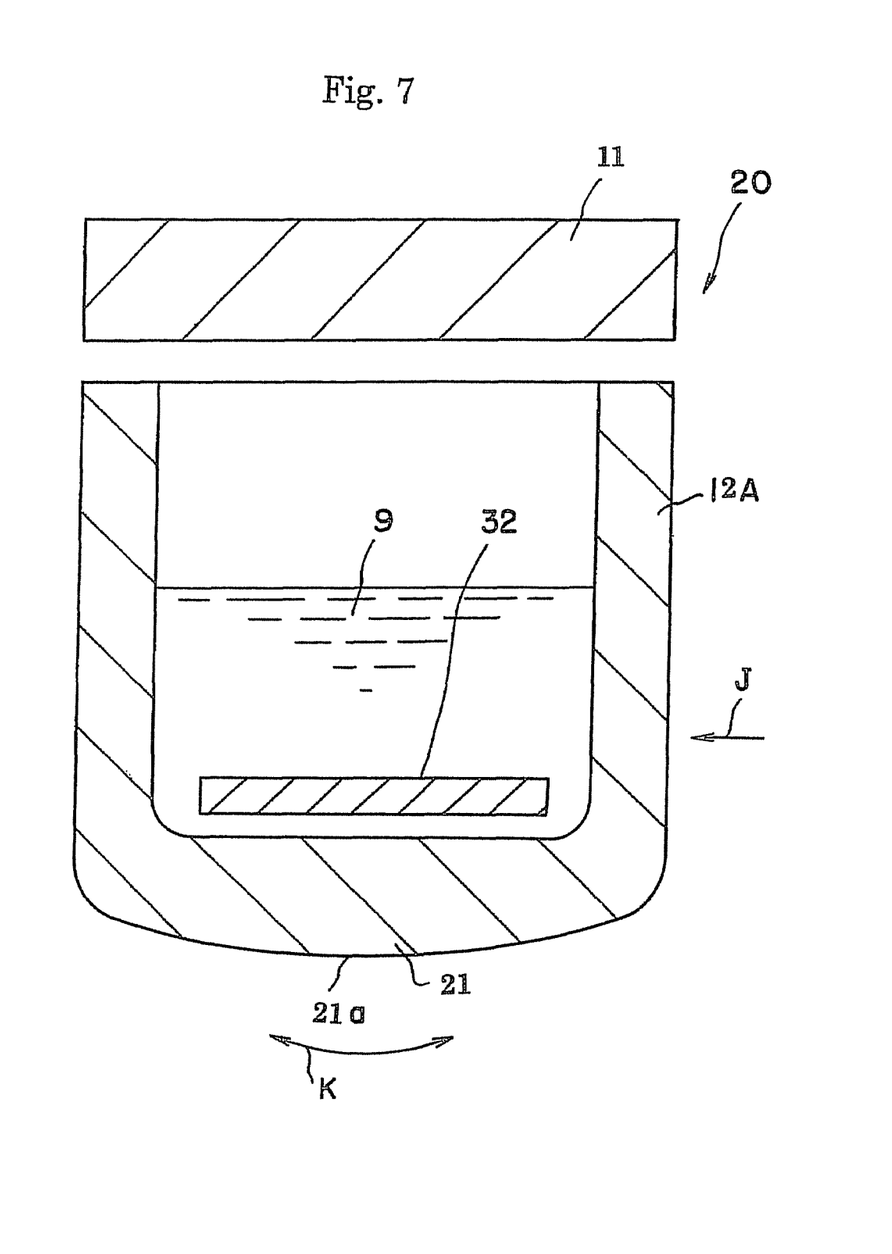
FIG. 7 is a cross-sectional view of a crucible 20 having an undersurface on which a protuberance is formed.

In a preferred embodiment, as shown in FIG. 7, a protuberance 21 is formed on the undersurface of the body 12A of the crucible 20. The protuberance 21 is preferably formed such that its surface curves smoothly, more preferably formed such that a vertex 21a of the protuberance 21 is at the center of the undersurface of the body 12A. Through the formation of such a shape, when a linear acceleration J is horizontally applied to the crucible 12, the body 12A of the crucible oscillates (as shown by the letter K). Therefore, by applying the linear acceleration J to the pressure vessel and the setter, the crucibles can be oscillated without being provided with a special driving mechanism. Furthermore, by applying a horizontally periodic motion (such as a reciprocating motion, a revolving motion, or a rotating motion) to the pressure vessel or the setter, a periodic oscillation K can be applied to the crucibles, whereby the solutions 9 in the crucibles can be stirred.

Figure 8:
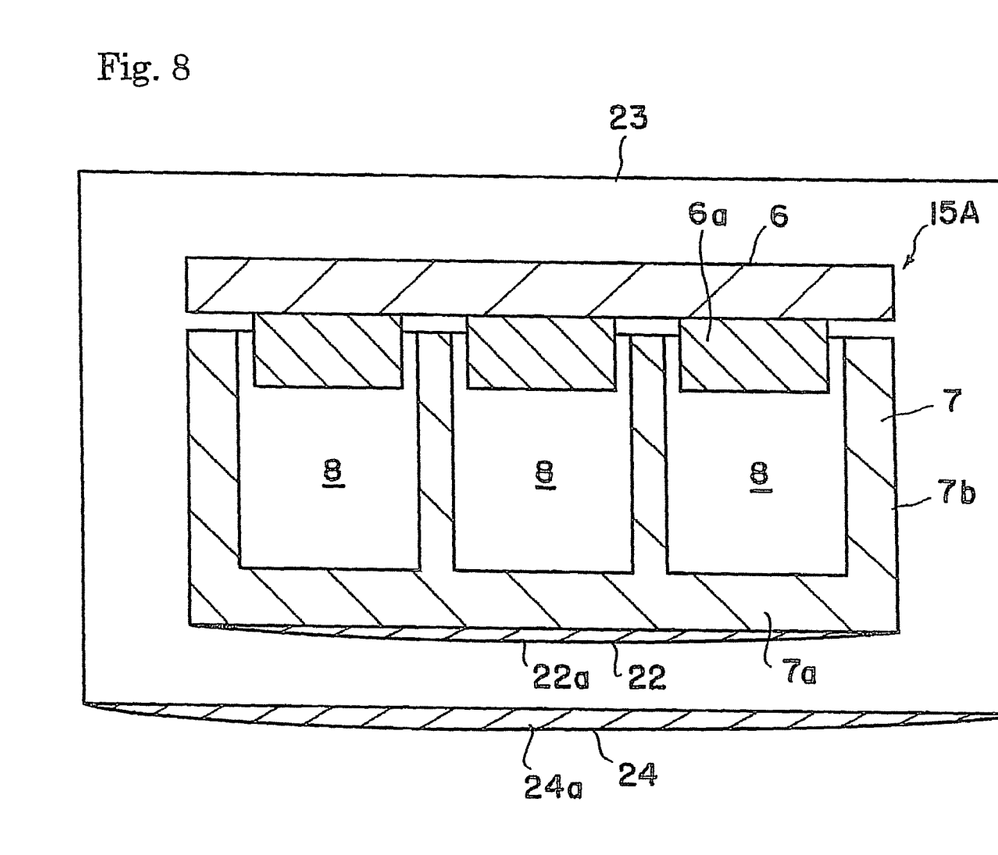
FIG. 8 is a cross-sectional view of a setter 15A having an undersurface on which a protuberance 22 is formed.

In still another preferred embodiment, as shown in FIG. 8, a protuberance 22 is formed on the bottom plate 7a of the body 7 of the setter 15A. The protuberance 22 is preferably formed such that its surface curves smoothly, more preferably formed such that a vertex 22a of the protuberance 22 is at the center of the undersurface of the body 7. Through the formation of such a shape, when a linear acceleration is horizontally applied to the pressure vessel 1, the setter 15A oscillates. Therefore, by applying the linear acceleration to the pressure vessel and the setter, the setter can be oscillated without being provided with a special driving mechanism. Furthermore, by applying a horizontally periodic motion (such as a reciprocating motion, a revolving motion, or a rotating motion) to the pressure vessel, a periodic oscillation can be applied to the setter, whereby the solutions 9 in the crucibles can be stirred.

In still another preferred embodiment, the setter is placed in a oxidation-preventing vessel 23, and a protuberance 24 is formed on the undersurface of the oxidation-preventing vessel 23. The protuberance 24 is preferably formed such that its surface curves smoothly, more preferably formed such that a vertex 24a of the protuberance 24 is at the center of the undersurface of the oxidation-preventing vessel 23. Through the formation of such a shape, when a linear acceleration is horizontally applied to the pressure vessel 1, the oxidation-preventing vessel 23 oscillates. Therefore, by applying the linear acceleration to the pressure vessel, the solutions 9 in the crucibles can be stirred without being provided with a special driving mechanism.

As described above, by applying a horizontally periodic motion to the pressure vessel, the solutions in the crucibles can be oscillated. As such a periodic motion, a reciprocating motion, a rotating motion, or a revolving motion is preferred. However, when the pressure vessel rotates on its own axis, the pipes and wires may be entangled, and therefore the revolving motion is particularly preferred.

For example, in FIG. 9(a), a reference numeral 27 denotes a central axis of the pressure vessel 1 and a reference numeral 26 denotes a revolution axis; the pressure vessel 1 is operated in such a manner that the central axis 27 revolves around the revolution axis 26 as indicated by the arrow A. At this time, the pressure vessel is not rotated on its own axis. Through such revolutions, the solutions in the crucibles placed within the pressure vessel can be simultaneously stirred with the same moment level. Further, by adjusting the velocity and amplitude of the revolving motion, the extent of stirring of the solutions in the crucibles can be adjusted.

Figure 10:
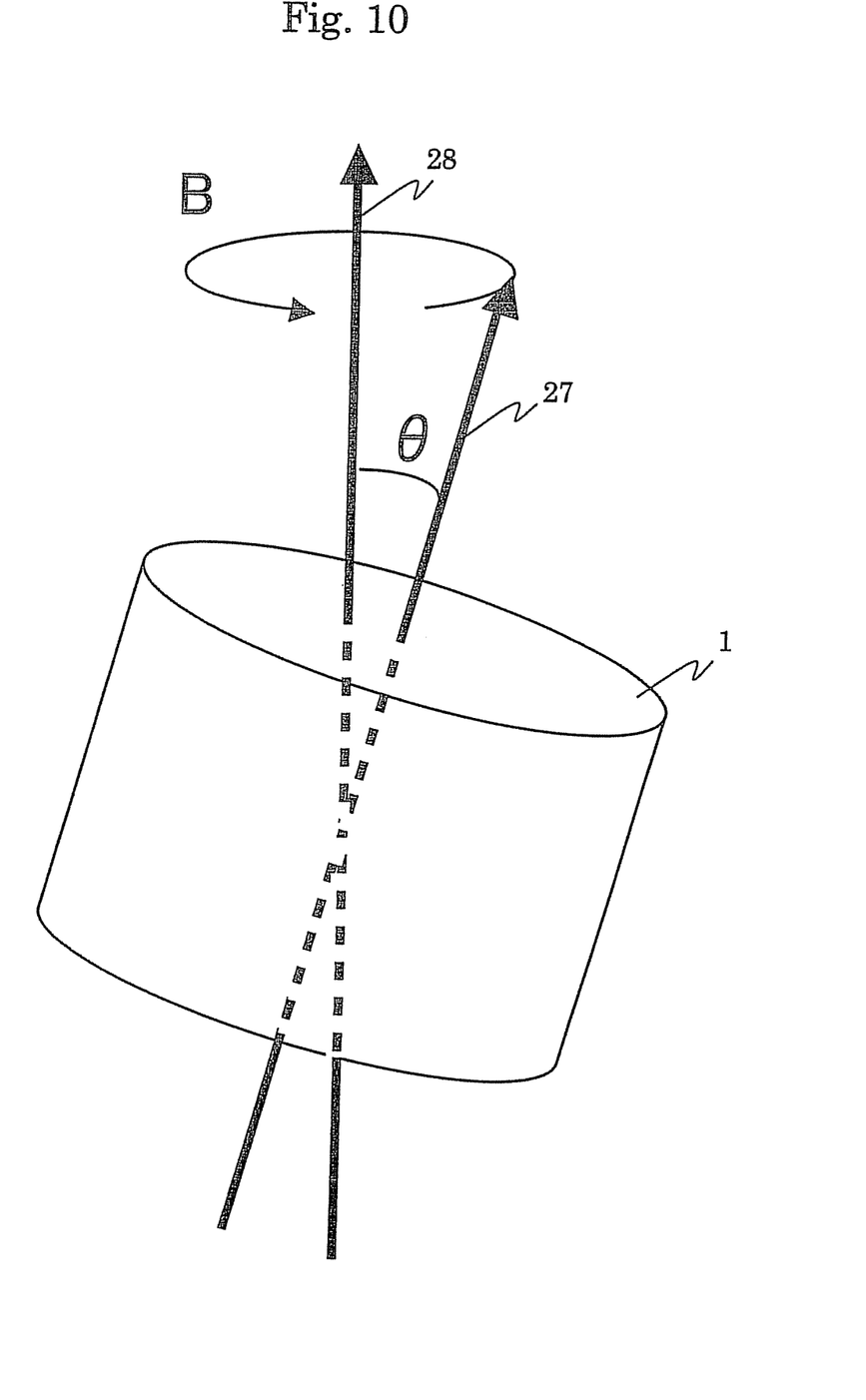
FIG. 10 is a diagrammatic illustration of the precession of the pressure vessel 1.

In still another preferred embodiment, the pressure vessel may be precessed instead of the horizontally periodic motion being used. For example, as shown in FIG. 10, the central axis 27 of the pressure vessel 1 is revolved around a vertical axis 28 as indicated by the arrow B with the central axis 27 tilted from the vertical axis 28 by θ°. At this time, the pressure vessel is not rotated on its own axis 27. Through such precession, the solutions in the crucibles placed within the pressure vessel can be simultaneously stirred with the same moment level. Further, by adjusting the velocity and tilt angle of the precession, the extent of stirring of the solutions in the crucibles can be adjusted.

In still another preferred embodiment, a monitor 25 is placed on part of the pressure vessel 1. In the monitor 25 is included a substance 33 with a viscosity close to that of the solutions under the conditions of the nitride single crystal growth. A reference numeral 31 denotes a vessel. When the pressure vessel 1 is moved with a driving force like the above and the solutions in the crucibles within the pressure vessel 1 are stirred, the extent of the stirring can be estimated by visually observing the state of the substance 33 being stirred in the monitor.

In specific growing of a nitride single crystal, a mixed-gas cylinder (not shown) is provided to the outside of the pressure vessel 1. The mixed-gas cylinder is filled with mixed gas of a predetermined composition. The mixed gas is compressed with a compressor to a predetermined pressure, and then supplied into the pressure vessel 1 through a supply pipe (not shown). Nitrogen gas contained in the atmosphere becomes a nitrogen source, and inert gas such as argon gas suppresses the evaporation of flux such as sodium. The pressure is monitored with a pressure indicator (not shown).

By making the heating elements generate heat and heating the mixed materials under pressure with the nitrogen gas supplied into the pressure vessel 1, the mixed materials are all melted in the crucibles to give solutions. By continuing to fulfil the predetermined conditions of the single crystal growth at this step, the nitrogen gas is stably supplied into the growth material solution, whereby single-crystal film is grown on the seed crystal.

In the present invention, a material of the furnace is not particularly limited; examples of such a material are a high alumina refractory brick (Isolite, ISO-COR (trade names), graphitic refractory (GRAFSHIELD (trade name)), and hollow spherulitic fused alumina (alumina bubble)).

In the present invention, a material for the heating element also is not particularly limited; examples of such a material are tantalum, SiC, SiC-coated graphite, nichrome, and Kanthal-Super (Trade Name).

In the single crystal growing apparatus according to the present invention, the unit for heating the starting mixture to produce the solution is not particularly limited; as such a unit, a hot isostatic pressing unit is preferably used, and otherwise an atmosphere-pressurized heating furnace may be used.

The flux for producing the solution is not particularly limited, however, it is preferable to use at least one selected from the group consisting of alkali metals and alkaline earth metals or the alloys thereof. As such metals, sodium, lithium and calcium are particularly preferred, and sodium is the most preferred.

Moreover, examples of a substance to be added to the starting mixture other than the flux and the single-crystal material are potassium, rubidium, cesium, magnesium, strontium, barium, and tin.

Also, as a dopant, a small quantity of impurity element can be added; for example, silicon can be added as an n-type dopant.

The use of the growth method according to the present invention can grow such single crystals as GaN, AlN, InN, mixed crystal thereof (AlGaInN) and BN, for example.

The heating temperature and pressure set in the single crystal growing process are selected based on the kind of single crystal to be grown and therefore are not particularly limited. The heating temperature can be set from 800 to 1500° C., for example. The pressure also is not particularly limited; however, the pressure is preferably set to not lower than 1 MPa, more preferably to not lower than 5 Pa. The upper limit of the pressure is not particularly specified, but it can be set to no higher than 200 MPa, for example.

The material of the crucible for performing such a reaction is not particularly limited, and therefore any hermetic material can be used, provided that it is durable under the intended conditions of heating and pressurization. Examples of such a material include a high-melting point metal such as metallic tantalum, tungsten or molybdenum, an oxide such as alumina, sapphire or yttria, a nitride ceramics such as aluminum nitride, titanium nitride, zirconium nitride or boron nitride, a carbide of high-melting point metal such as tungsten carbide or tantalum carbide, and a thermal decomposition product such as p-BN (pyrolytic BN) or p-Gr (pyrolytic graphite).

In the following, examples of the single crystal and the procedure for growing the same will be shown more specifically.

(Growth Example of Gallium Nitride Single Crystal)

Through the utilization of the present invention and the use of flux containing at least sodium metal, a gallium nitride single crystal can be grown. A gallium starting material is mixed into the flux. As the gallium starting material, a gallium single metal, a gallium alloy or a gallium compound can be used; in terms of handling, a gallium single metal can be used preferably.

In the flux, a metal other than sodium, such as lithium, can be contained. The ratio between the gallium starting material and the flux starting material such as sodium may be set suitably; however, it is considered that an excessive quantity of sodium is used in general, which is not limited, of course.

In this embodiment, a gallium nitride single crystal is grown in an atmosphere of nitrogen-containing mixed gas under a total pressure of 300 to 2000 atm. The setting of the total pressure to not lower than 300 atm can grow a fine-quality gallium nitride single crystal at a high-temperature region of, for example, 900° C. or higher, more preferably 950° C. or higher. Although the reason is not obvious, it is assumed that since the solubility of the nitrogen increases with increase in the temperature, the nitrogen dissolves in the growth solution efficiently. It is undesirable to set the total pressure in the atmosphere to higher than 2000 atm, since the density of the high-pressure gas and the density of the growth solutions become considerably close to each other and thus the solutions are difficult to be retained in the vessel for reaction thereof.

TABLE 1

Densities of various materials (g/cm³)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculation) | 0.5 (speculation) |

In a preferred embodiment, during the growth, the nitrogen partial pressure in the atmosphere is set to 100 to 2000 atm. When the nitrogen partial pressure is set to not lower than 100 atm, the dissolution of the nitrogen in the flux is promoted at a high-temperature region of, for example, of 1000° C. or higher, and a fine-quality gallium nitride single crystal can be grown. From this point of view, it is more preferable to set the nitrogen partial pressure in the atmosphere to not lower than 200 atm. Practically, it is preferable to set the nitrogen partial pressure to not higher than 1000 atm.

The kind of gas contained in the atmosphere other than the nitrogen gas is not limited; however, inert gas is preferred, and argon, helium, or neon is particularly preferred. The partial pressure of the gas other than nitrogen corresponds to a value obtained by subtracting the nitrogen partial pressure from the total pressure.

In still another preferred embodiment, the growth temperature of the gallium nitride single crystal is 950° C. or higher, more preferably 1000° C. or higher; at such a high-temperature region as well, a fine-quality gallium nitride single crystal can be grown. Further, there is a possibility that productivity can be enhanced through the growth at both high temperature and high pressure.

Although there is no upper limit to the growth temperature of the gallium nitride single crystal in particular, it is preferable to set the upper limit to 1500° C. or lower since the crystal is difficult to grow at excessively high growth temperature. From this point of view, it is more preferable to set the upper limit to 1200° C. or lower.

A material for a substrate used for epitaxially growing the gallium nitride crystal is not particularly limited; examples of such a material are sapphire, AlN template, GaN template, free-standing GaN substrate, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$, and $NdGaO_3$. It is possible to use cubic perovskite composite oxides represented by the composition formula $[A_{1-y}(Sr_{1-x}Ba_x)_y][(Al_{1-z}Ga_z)_{1-u}Du]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) can be also used.

(Growth Example of AlN Single Crystal)

The present invention could be confirmed to be effective at growing an AlN single crystal by pressurizing a melt including a flux containing at least aluminum and an alkaline earth metal in a nitrogen-containing atmosphere under specified conditions.

EXAMPLES

A gallium nitride single crystal was grown using the foregoing method described with reference to FIGS. 1, 2, 3, 5, 7 and 9.

Here, the setters and lids were made of aluminum nitride ceramic. The four-tier setters were placed within the pressure vessel, each setter was partitioned into the five accommodation chambers, and the crucible was placed in each accommodation chamber. The heating elements 3A, 3B, 3C and 3D were formed of nichrome.

Metallic Na, metallic Ga, and metallic Li were weighed out in a glove box by 90 g, 100 g and 30 mg, respectively. First, the metallic Ga and the metallic Li were enclosed by the metallic Na. These materials were charged in each alumina crucible with inside diameter φ of 70 mm. Further, as seed crystals, an AlN template substrate, GaN template substrate or free-standing GaN crystal substrate with φ of 2 inches was used. The substrate was horizontally placed on the bottom of the crucible 10 with the single-crystal thin film of the template being upward, or the Ga surface of the free-standing GaN single-crystal substrate being upward. The AlN template substrate was obtained by epitaxially growing an AlN single-crystal thin film on a sapphire substrate in 1 micron, and the GaN template substrate was obtained by epitaxially growing a GaN single-crystal thin film on a sapphire substrate in 3 microns.

Figure 9:
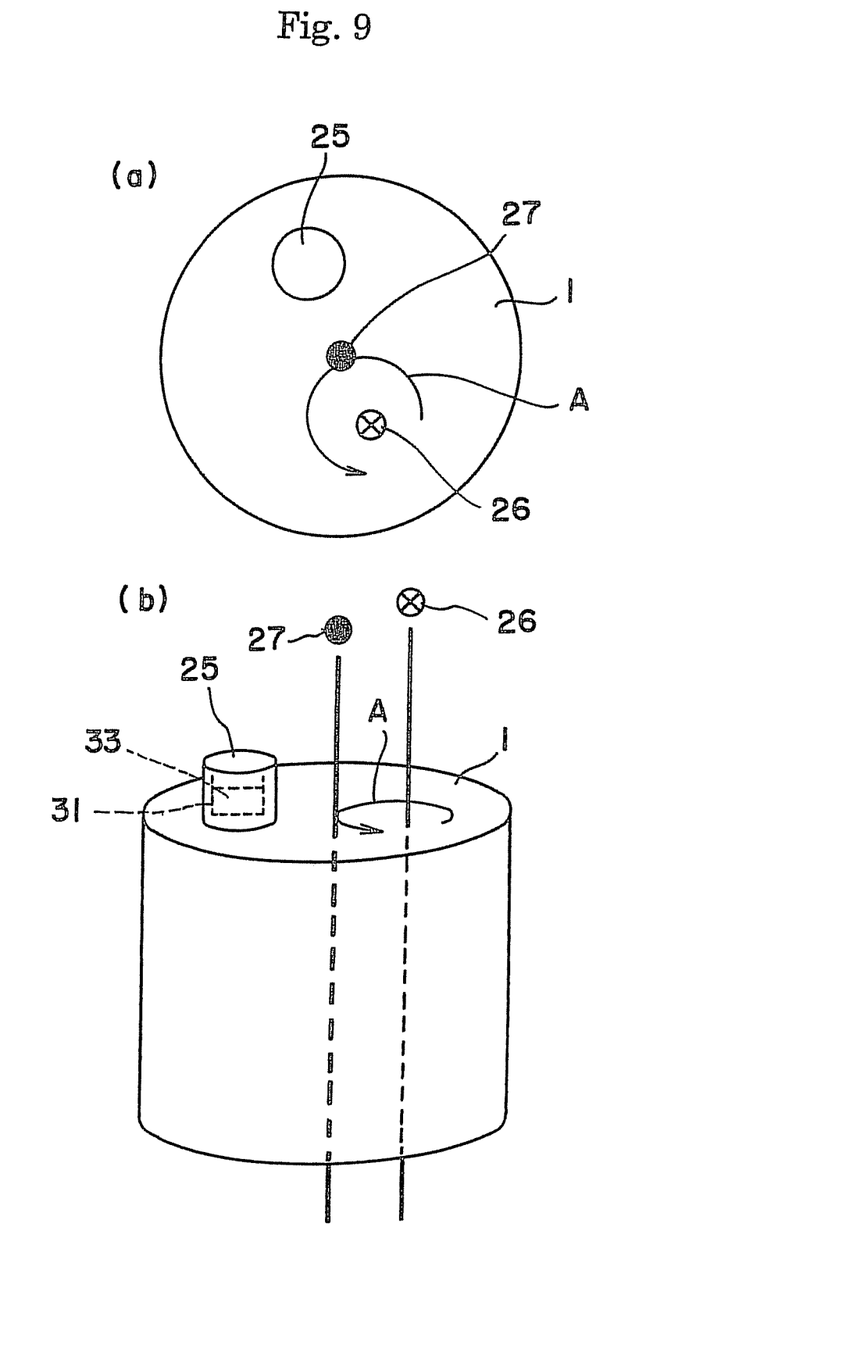
FIG. 9(a) is a top view of a pressure vessel 1 the revolving motion of which is illustrated.
FIG. 9(b) is a perspective view of the pressure vessel 1 the revolving motion of which is illustrated.

The pressure vessel 1 was evacuated with a vacuum pump to remove air within the vessel 1, substituted by nitrogen gas, raised in temperature and pressure to 900° C. and 50 atm over one hour, and then retained at 900° C. for 100 hours. At that time, as shown in FIG. 9, the pressure vessel 1 was revolved around the revolution axis while visually observing the monitor vessel 25 placed on the top of the pressure vessel 1, and then the pressure vessel 1 was held in a stirred state considered optimum for 100 hours.

Then, the pressure vessel 1 was naturally cooled to room temperature over 20 hours, taken out of the growth apparatus, and treated with ethanol to dissolve Na and Li. Thereafter, the remaining Ga was removed by dipping in diluted hydrochloric acid to take out the GaN crystal.

Among the twenty single crystals thus obtained, one in two of the crucibles were defective, in which many polycrystals were formed, but gallium nitride single crystals grown in a thickness of about 5 mm could be taken out of the other eighteen crucibles. The GaN crystals had a diameter of 2 inches and a substantially round shape and they were nearly colorless and transparent. Further, when the crystallinity of the resulting GaN single crystals was evaluated by X-ray rocking curve measurement, the half-value width of (0002) reflection was from 30 to 70 seconds, which demonstrated that the resulting crystals were fine-quality gallium nitride single crystals.

The present invention has been described hereinabove with reference to the specific embodiments; however, the invention is not limited to these embodiments, and can be practiced while making various modifications and alterations without departing from the scope of the appended claims.

The invention claimed is:

1. A method for producing a nitride single crystal using a solution comprising a flux and a raw material, the method using a growth apparatus comprising:
    a plurality of crucibles each for containing the solution,
    a heating element for heating the crucibles, and
    a pressure vessel for containing at least the crucibles and the heating element and for filling an atmosphere comprising at least nitrogen gas; and
    the method comprising the step of putting one seed crystal in each of the crucibles to grow the nitride single crystal on the seed crystal,
    orienting the pressure vessel so that a central axis thereof is inclined at an angle relative to the vertical axis, and revolving the pressure vessel around the vertical axis while maintaining said central axis of the pressure vessel at said angle, wherein the pressure vessel is not rotated around said central axis and the solutions in the crucibles are simultaneously stirred by the inclined, revolving movement of the pressure vessel during the growth of the nitride single crystal, and the one seed crystal in each of the crucibles is immersed in the solution contained in the crucible during the growth of the nitride single crystal.

2. The method for producing a nitride single crystal of claim 1, further using a setter comprising a thermally conductive material for accommodating the crucibles.

3. The method for producing a nitride single crystal of claim 2, wherein the setter has plural accommodation chambers horizontally placed and wherein the accommodation chambers accommodate the crucibles, respectively.

4. The method for producing a nitride single crystal of claim 3, using crucible-heating means corresponding to each of the accommodation chambers.

5. The method for producing a nitride single crystal of claim 3, using temperature-measuring means corresponding to each of the accommodation chambers.

6. The method for producing a nitride single crystal of claim 1, wherein a plurality of the heating elements are vertically placed within the pressure vessel to separately control the calorific values of the heating elements, respectively.

7. The method for producing a nitride single crystal of claim 1, wherein a protuberance is formed on the undersurface of the crucible to oscillate the crucible by moving the pressure vessel.

8. The method for producing a nitride single crystal of claim 1, wherein a protuberance is formed on the undersurface of the setter to oscillate the setter by moving the pressure vessel.

9. The method for producing a nitride single crystal of claim 1, wherein the solutions in the crucibles are simultaneously stirred by precessing the pressure vessel.

10. The method for producing a nitride single crystal of claim 1, wherein a stirring medium is put in each of the crucibles with the medium contacting the solution, wherein at least a surface region of the stirring medium is made of a material unreactive with the solution, and wherein the solutions in the crucibles are stirred simultaneously.

11. The method for producing a nitride single crystal of claim 10, wherein the stirring medium has a spherical shape.

12. The method for producing a nitride single crystal of claim 1, wherein a monitor is placed on the pressure vessel, the monitor containing a substance having a viscosity that is within 50 centipoises of the viscosity of the solution.

13. The method for producing a nitride single crystal of claim 1, wherein the pressure vessel is moved by a driving mechanism, wherein the crucibles are moved only by said movement of the pressure vessel.

14. An apparatus for producing a nitride single crystal using a solution comprising a flux and a raw material, the apparatus comprising:

a plurality of crucibles each for containing the solution and one seed crystal;

a heating element for heating the crucibles; and a pressure vessel for containing at least the crucibles and the heating element and filling an atmosphere comprising at least nitrogen gas, orienting the pressure vessel so that a central axis thereof is inclined at an angle relative to the vertical axis, and revolving the pressure vessel around the vertical axis while maintaining said central axis of the pressure vessel at said angle, wherein the pressure vessel is not rotated around said central axis and the solutions in the crucibles are simultaneously stirred by moving the inclined, revolving pressure vessel during the growth of the nitride single crystal, and the one seed crystal in each crucible is immersed in the solution contained in the crucible during the growth of the nitride single crystal.

15. The apparatus for producing a nitride single crystal of claim 14, further comprising a setter comprising a thermally-conductive material, the setter accommodating the crucibles.

16. The apparatus for producing a nitride single crystal of claim 15, wherein the setter has accommodation chambers horizontally placed and wherein each of the accommodation chambers accommodates each of the crucibles.

17. The apparatus for producing a nitride single crystal of claim 16, further comprising crucible-heating means corresponding to each of the accommodation chambers.

18. The apparatus for producing a nitride single crystal of claim 16, further comprising temperature-measuring means corresponding to each of the accommodation chambers.

19. The apparatus for producing a nitride single crystal of claim 14, wherein a plurality of the heating elements are vertically placed within the pressure vessel to separately control the calorific values of the heating elements, respectively.

20. The apparatus for producing a nitride single crystal of claim 14, wherein a protuberance is formed on the undersurface of the crucible to oscillate the crucible by moving the pressure vessel.

21. The apparatus for producing a nitride single crystal of claim 14, wherein a protuberance is formed on the undersurface of the setter to oscillate the setter by moving the pressure vessel.

22. The apparatus for producing a nitride single crystal of claim 14, wherein the solutions in the crucibles are simultaneously stirred by precessing the pressure vessel.

23. The apparatus for producing a nitride single crystal of claim 14, wherein a stirring medium is put in each of the crucibles with the medium contacting the solution, wherein at least a surface region of the stirring medium is made of a material unreactive with the solution, and wherein the solutions in the crucibles are stirred simultaneously.

24. The apparatus for producing a nitride single crystal of claim 23, wherein the stirring medium has a spherical shape.

25. The apparatus for producing a nitride single crystal of claim 14, further comprising a monitor placed on the pressure vessel, the monitor containing a substance having a viscosity that is within 50 centipoises of the viscosity of the solution.

* * * * *